United States Patent [19]

Mayama et al.

[11] 4,291,241

[45] Sep. 22, 1981

[54] TIMING SIGNAL GENERATING CIRCUIT

[75] Inventors: Koichi Mayama, Mobara; Noboru Yamaguchi, Kokubunji; Mamoru Sugie, Hachioji; Yuzo Kita, Fuchu; Shigeru Yoshizawa, Tokorozawa, all of Japan

[73] Assignee: Hitachi, Ltd., Tokyo, Japan

[21] Appl. No.: 12,708

[22] Filed: Feb. 16, 1979

[30] Foreign Application Priority Data

Feb. 20, 1978 [JP] Japan ................................ 53-17662

[51] Int. Cl.³ .............................................. H03K 5/15
[52] U.S. Cl. .................................... 307/269; 307/243; 307/480
[58] Field of Search ...................... 307/243, 269, 208

[56] References Cited

U.S. PATENT DOCUMENTS

| | | | |
|---|---|---|---|
| 3,104,330 | 9/1963 | Hamilton | 307/269 X |
| 3,383,525 | 5/1968 | Arksey | 307/269 |
| 3,668,431 | 6/1972 | Locke | 307/243 |
| 3,760,358 | 9/1973 | Isii et al. | 307/243 X |
| 3,873,851 | 3/1975 | Weimer | 307/243 X |

*Primary Examiner*—John S. Heyman
*Attorney, Agent, or Firm*—Craig and Antonelli

[57] ABSTRACT

A timing signal generating circuit including a clock source which generates clock pulses of a predetermined period, a binary counter which divides the frequency of the clock pulses from the clock source by n, a logical array which decodes an output of the binary counter and which is composed of semiconductor elements and flip-flop circuits which are set or reset by outputs of the logical array in response to the clock pulses from the clock source with the outputs of the flip-flop circuits being used as timing signals.

10 Claims, 15 Drawing Figures

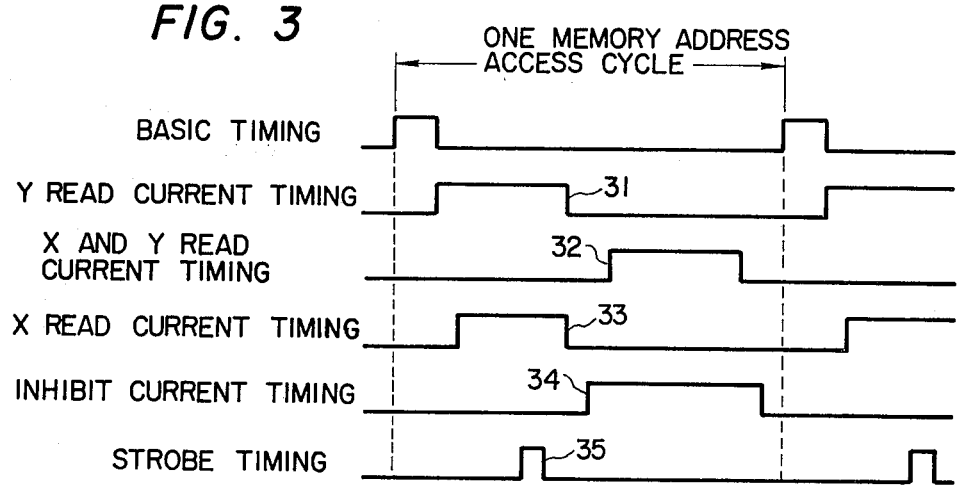
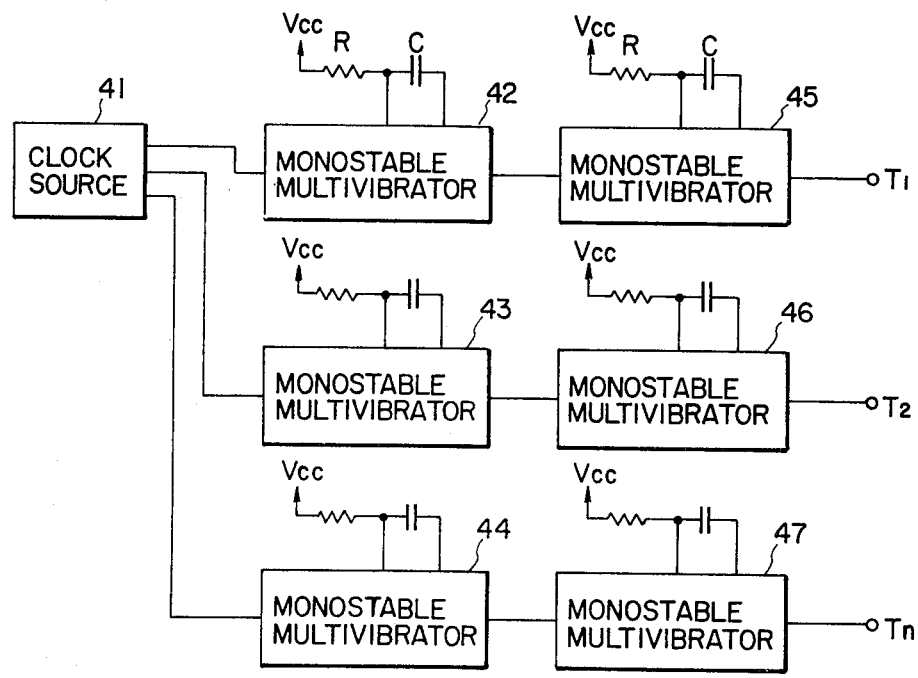

TIMING SIGNAL GENERATING CIRCUIT

LIST OF THE PRIOR ART

The following references are cited to show the state of the art:

(1) Japanese Patent Application, Laying-Open No. 14223/76
(2) U.S. Pat. No. 3,383,525

BACKGROUND OF THE INVENTION

1. Field of the Invention

This invention relates to a timing signal generating circuit in an electronic device which requires a plurality of repeated timing signals for its operation.

2. Description of the Prior Art

In an electronic device such as a magnetic bubble memory and a core memory, a large number of timing signals are required during one basic operation cycle. In order to generate these timing signals, a timing signal generating circuit is provided.

As a prior-art timing signal generating circuit of this type, there has been known a circuit arrangement wherein a plurality of clock signals derived from a clock source are respectively applied to circuits each including monostable multivibrators connected in two stages and wherein outputs from the circuits are used as the timing signals. With such a circuit arrangement, however, a large number of monostable multivibrators are necessary, so that the number of constituent parts is large, resulting in a large size, a high cost and a low reliability. Another problem is that, on account of the dispersions or deviations of the components, the times or positions and the durations or widths of the timing signals deviate.

A circuit arrangement as disclosed in, for example, Japanese Patent Application, Laying-Open No. 1423/76 has therefore been proposed, according to which clock signals from a clock source are counted by a counter, outputs of the counter are applied as address inputs of a read only memory (hereinbelow, abbreviated to "ROM"), and outputs of the ROM are set in a latch circuit with the clock signals, thereby to form the timing signals. With such a circuit arrangement, however, the capacity of the ROM is large, so that the number of circuit constituent elements is large. In point of packaging, the chip size becomes large, and the fabrication of the circuit arrangement in the form of an integrated circuit is difficult. Another problem is the delay time attributed to the ROM.

SUMMARY OF THE INVENTION

An object of this invention is to provide a timing signal generating circuit which has a small number of circuit constituent elements and which is readily put into the form of an integrated circuit.

Another object of this invention is to provide a timing signal generating circuit which can simply set the pulse positions and pulse widths of timing signals and which can execute more general operations with external control inputs.

Still another object of this invention is to generate high-speed timing pulses. That is, according to this invention, an operation of 30 MHz is possible by the use of a bipolar integrated circuit, and clocks on the order of 10 MHz are realizable even with a MOS integrated circuit.

In accordance with the present invention, clock pulses from a clock source have the frequency divided by n by means of a binary counter, outputs of the binary counter are decoded by means of a logical array composed of diodes, flip-flops are set or reset with the decoded outputs in response to the clock pulses, and that outputs of the flip-flops are used as timing signals.

Other objects, features and advantages of the present invention will become more apparent from the following description taken in conjunction with the accompanying drawings.

BRIEF DESCRIPTION OF THE DRAWINGS

FIG. 3 is a timing chart of a core memory, FIG. 4 is a circuit diagram of a prior-art timing signal generating circuit which employs monostable multivibrators.

DETAILED DESCRIPTION OF THE PRIOR ART

Figure 1:
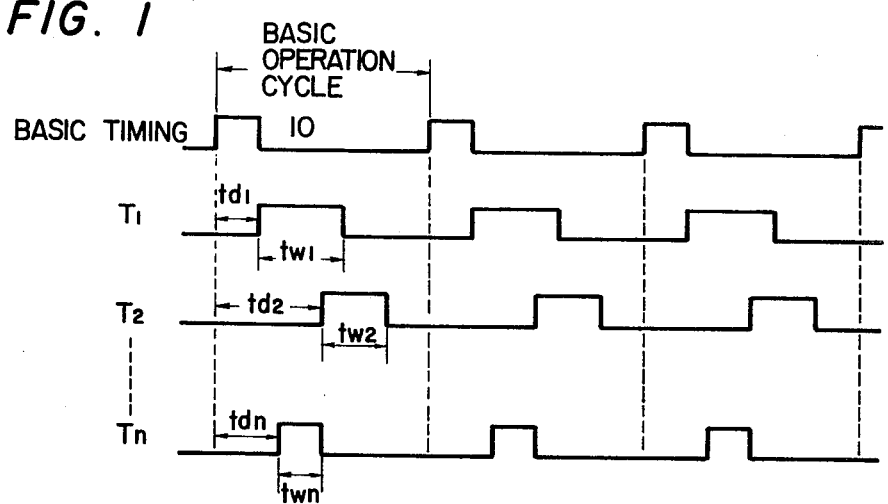
FIG. 1 is a timing chart of an electronic device which requires a plurality of timing signals within a basic operation cycle.

In some types of electronic devices, as illustrated in FIG. 1, a plurality of timing signals $T_1$, $T_2$, ... and $T_n$ whose pulse positions ($t_{d1}$, $t_{d2}$, ... and $t_{dn}$) and pulse widths ($t_{w1}$, $t_{w2}$, ... and $t_{wn}$) are respectively set at predetermined values with respect to a basic timing signal 10 are required during a basic operation cycle for the operation.

In, for example, a magnetic bubble memory, a bubble domain in a storage medium is shifted every bit on a bubble propagation line of permalloy arranged on a chip. For the shifting operation, a rotating magnetic field is established by causing currents to flow through two coils which are wound outside the chip and which intersect orthogonally to each other.

On the other hand, regarding the generation, annihilation, replication and detection of the bubble and the transfer of the bubble into or out of a minor loop, the intended operations can be executed in such a way that when the bubble domain has come to a specified position having the corresponding function, a pulse current is caused to flow through a conductor loop formed of an aluminum pattern arranged on the chip.

Figure 2:
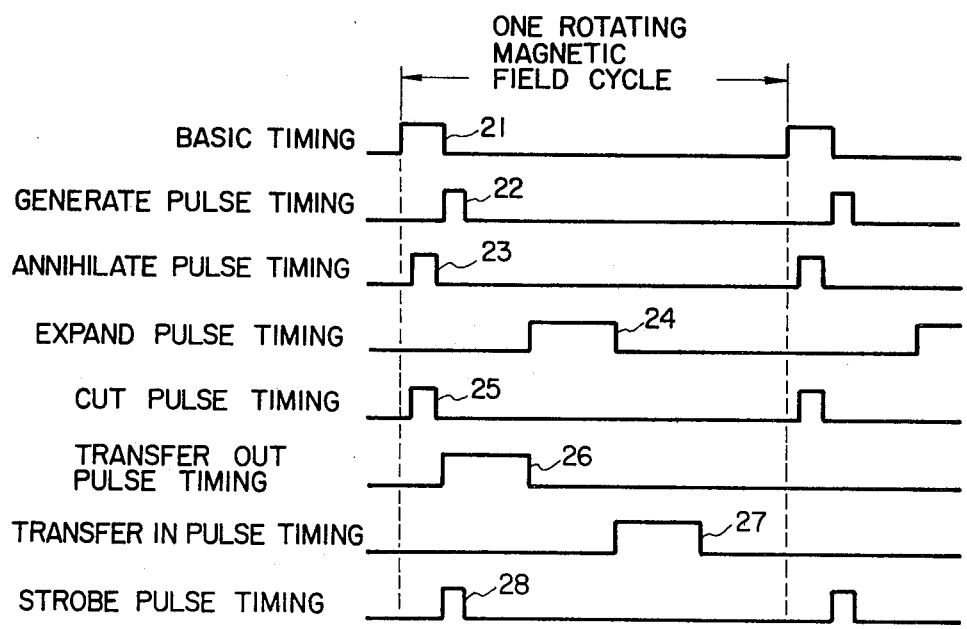
FIG. 2 is a timing chart of a magnetic bubble memory.

Herein, the timing positions at which the pulse currents are caused to flow need to conform with specified time positions in synchronism with the rotating magnetic field. In the magnetic bubble memory, therefore, a plurality of timing signals 22 to 28 are required with respect to a basic timing 21 determining one rotating magnetic field cycle as illustrated in FIG. 2. That is, eight signals, including the basic timing signal, the generate pulse timing signal 22, the annihilate pulse timing signal 23, the expand pulse timing signal 24, the cut pulse timing signal 25, the transfer-out pulse timing signal 26, the transfer-in pulse timing signal 27 and the strobe pulse timing signal 28 are necessary.

As another example, timing signals required in a core memory are illustrated in FIG. 3. A period of time for accessing (reading or writing) the stored content of a certain address is made a basic cycle, during which timing signals 31 to 34 for X, Y and inhibit driving currents and a strobe timing signal 35 for detecting a core output are required. As illustrated, the Y read current timing signal 31, the X and Y read current timing signal 32, the X read current timing signal 33, the inhibit current timing signal 34 and the strobe timing signal 35 are necessary.

As a timing signal generating circuit which generates the plurality of timing signals of different time positions synchronously within the basic operation cycle as described above in such an electronic device, there has been provided a circuit as shown in FIG. 4, which employs a clock source 41 and monostable multivibrators 42 to 47. The pulse positions are determined by the monostable multivibrators at the preceding stages 42 to 44, while the pulse widths are determined by the monostable multivibrators at the succeeding stages 45 to 47.

However, in case where the timing signal generating circuit is constructed with the monostable multivibrator circuits in this manner, various problems arise. Firstly, the number of constituent parts is large. This is especially conspicuous when the number of timing signals is large. Therefore, the space which the circuit occupies becomes large, and the cost of the circuit becomes comparatively high due to expenses relating to assemblage and tests. Secondly, the reliability becomes lower in accordance with the large number of components. Thirdly, since resistors R and capacitors C of R-C discharging circuits for determining the positions and widths of the timing signals have dispersions or deviations in the resistances and capacitances, respectively, deviations occur in the positions and widths of the timing signals.

Figure 5:
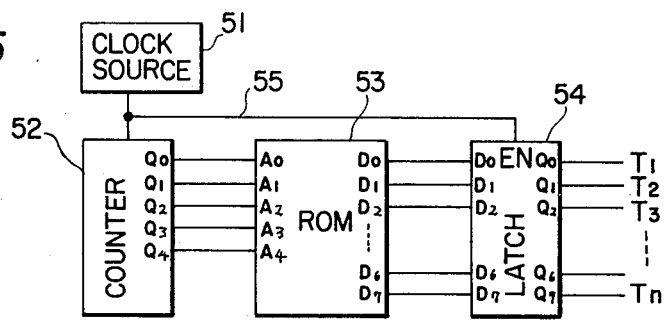
FIG. 5 is a circuit diagram of a prior-art timing signal generating circuit which employs a ROM.

As an expedient for making improvements with regard to the aforementioned disadvantages, a circuit has been provided as shown in Japanses Patent Application, Laying-Open No. 14223/76. In this circuit, a basic operation cycle is divided by n, and timing signals are set at any desired positions of the divided time intervals. The schematic construction of the circuit is shown in FIG. 5. Using clock signals 55 generated by a clock source 51, a counter 52 is brought into the counting operation. Outputs of the counter 52 are used as address inputs of a read only memory (ROM) 53, and data outputs of the ROM 53 are set in a latch circuit 54 with the clock signals 55. Thus, timing signals $T_1, T_2, \ldots$ and $T_n$ are formed. At this time, one timing signal is caused to correspond with each bit of the output data of the ROM 53, and an information "1" or "0" is bestowed on each address as the stored information of the ROM 53. Accordingly, a ROM capacity of $n \times m$ bits is required for generating m timing pulses with the basic cycle divided by n.

With the aforedescribed circuit, the number of constituent parts can be sharply curtailed. However, when it is intended to put the whole timing signal generator circuit into the form of an integrated circuit, there is the problem that the number of circuit constituent elements is large on account of the large ROM capacity, the chip size becomes large with regard to packaging. Especially when the number of the division within the basic operation cycle is increased in order to raise the set position precision of the timing signals, the capacity of the ROM augments sharply. For example, when the number of the division is doubled, the ROM capacity doubles. Moreover, since the delay time within the ROM is comparatively long, such a system is subject to limitations for a high-speed timing circuit. For example, when TTL elements are used, a value of 10 MHz is the limit as the clock frequency. Additionally, the circuit is inoperable for clocks on the order of 30 MHz.

DETAILED DESCRIPTION OF THE PREFERRED EMBODIMENTS

Figure 6:
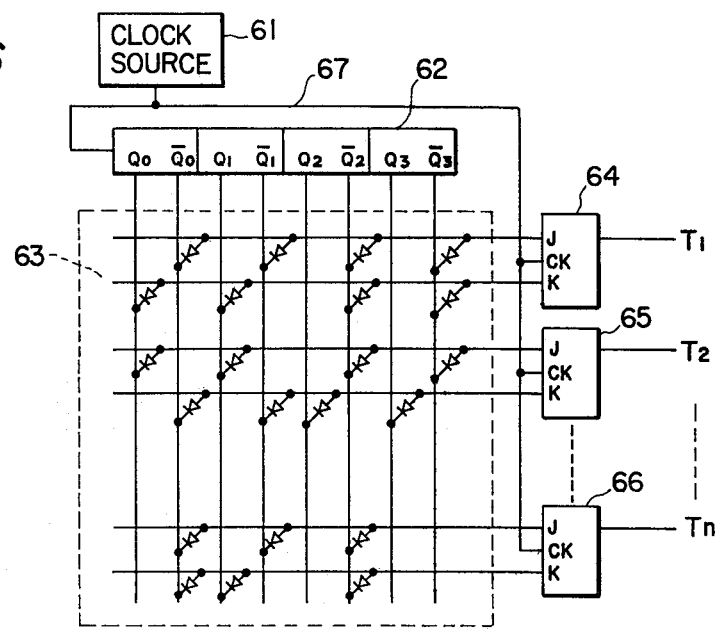
FIG. 6 is a circuit diagram of an embodiment of a timing signal generating circuit according to this invention.

An embodiment of a timing signal generating circuit according to the present invention is illustrated in FIG. 6. A clock source 61 generates a basic clock signal 67. The clock signal 67 becomes a count signal of a binary counter 62. When by way of example the binary counter 62 is formed of 4 bits as illustrated in the figure, outputs of the binary counter 62 assume the status "0" to "15" owing to the combinations of the 4 bits. The outputs of the binary counter 62 enter an AND array 63 which is an AND logic ciruit for decoding. The AND array 63 is not a mere AND gate, but rather is a circuit which forms AND logics in the shape of a logic array, such as the illustrated AND logics based on the diode array, in order to provide a plurality of decoded output signals in response to a plurality of input signals. The outputs of the AND array 63 becomes J or K inputs of J-K flip-flops 64, 65, ... and 66. Accordingly, under the condition in which ANDs are taken by the diode arrangement in the AND array 63 among the statuses "0"–"15" of the binary counter 62, the J or K inputs of the J-K flip-flops 64–66 are received, and the J-K flip-flops 64–66 are set or reset by the subsequent clock signal 67. Since respective timing signals $T_1, T_2, \ldots$ and $T_n$ are outputs of the J-K flip-flops 64–66, they are provided from the set time to the reset time of the J-K flip-flops 64–66 in dependence on the positions of diodes set in the AND array 63.

Figure 7:
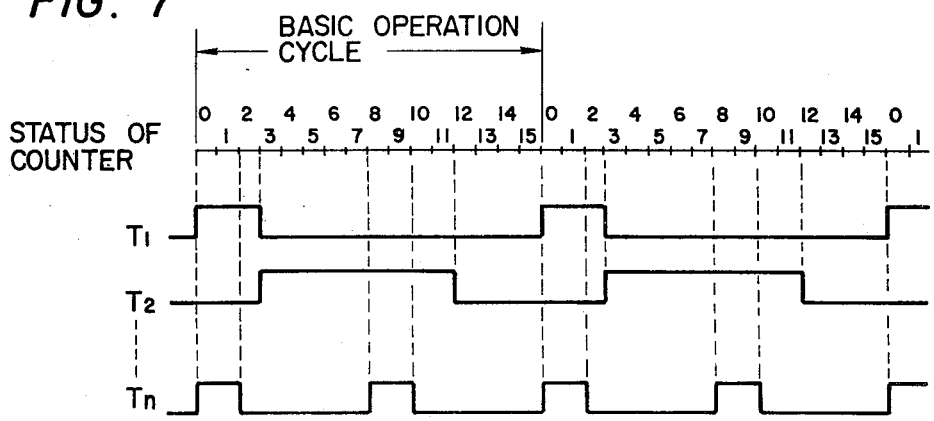
FIG. 7 is a diagram showing examples of timing signals which are generated by the timing signal generating circuit of FIG. 6.

FIG. 7 shows a timing chart in the case where the diode positions in the AND array 63 are set as in FIG. 6. The binary counter 62 repeats the statuses "0"–"15". Therefore, assuming that one circulation of the statuses of the binary counter 62 is the basic operation cycle as illustrated in FIG. 7, the timing signals $T_1, T_2, \ldots$ and $T_n$ can have the positions and widths set in intervals of 1/16 of the basic operation cycle. For example, with regard to the timing signal $T_1$, the J input of the flip-flop 64 enters when the status of the binary counter 62 is "0", and the K input thereof enters when it is "3", so that the timing signal is provided during the period during which the binary counter 62 assumes the status "0"–"2". When, as in the example of the timing signal $T_n$ in FIG. 6, no diode is connected to the output signal of the uppermost digit bit of the binary counter 62, two or more timing signals can be generated within the basic operation cycle as illustrated in FIG. 7.

The reason why the J-K flip-flops 64–66 are used in the arrangement of FIG. 6 is as follows. In the case where the outputs of the AND array 63 are directly employed as set or reset inputs of R-S flip-flops, noise outputs will be provided from the AND array 63 due to the delay time deviations of the circuit elements, etc., in the switching period in which the status of the binary counter 62 changes after the clock input 67 has entered this binary counter 62, and they will set or reset the R-S flip-flops to give rise to malfunctions. Therefore, timing signals are necessary which serve to set or reset the R-S flip-flops with the output status of the AND array 63 after the output status of the binary counter 62 has been settled. For this reason, the J-K flip-flops are used in the embodiment of FIG. 6.

Figure 8:
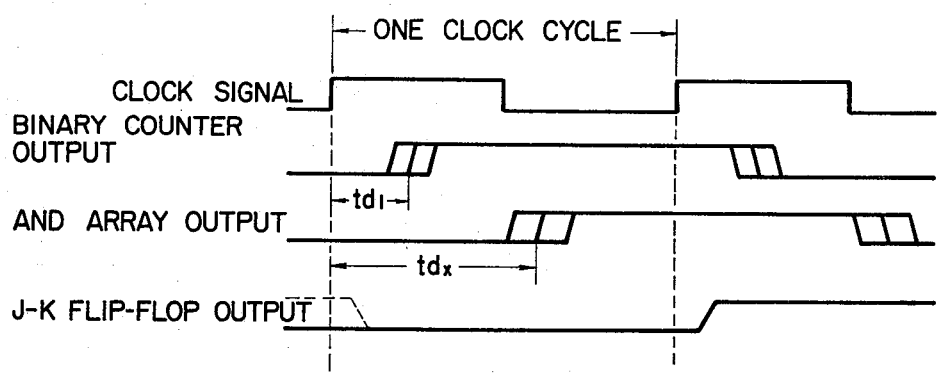
FIG. 8 is a timing chart of internal signals in the timing signal generating circuit of FIG. 6, FIGS. 9 to 11 are circuit diagrams each showing another embodiment of the timing signal generating circuit according to this invention.

FIG. 8 shows a timing chart of internal signals in the circuit of FIG. 6. Since the binary counter 62 is operated by the leading edge of the clock signal 67, its output is delayed a period of time $t_{d1}$ relative to the clock signal. Further, the delay time in the AND array 63 is added, so that the J or K input of the J-K flip-flops 64–66 is delayed a period of time $t_{d2}$ relative to the clock signal 67. The J-K flip-flops 64–66 are set or reset by the same clock signal 67 as the clock signal which puts the binary counter 62 into the counting operation. Accordingly, the delay time $t_{d2}$ in the binary counter 62 and the AND array 63 is required to be shorter than one clock cycle time of the clock signal 67. If the delay time $t_{d2}$ exceeds one clock cycle time, the clock signal 67 may be delayed through a delay circuit (not shown) and then utilized as timing signals for setting or resetting the J-K flip-flops 64–66.

Figure 9:
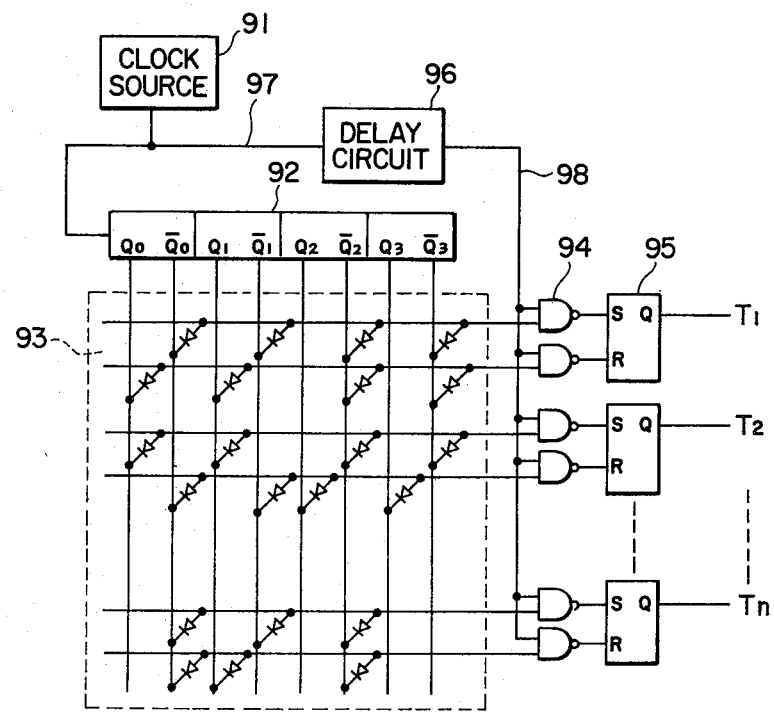

FIG. 9 shows another embodiment of the timing signal generating circuit according to this invention. In this embodiment, the flip-flops which are utilized are R-S flip-flops 95 which are set or reset by low-level inputs, and NAND gates 94 arranged for receiving outputs of an AND array 93 and a timing signal 98 for setting or resetting the R-S flip-flops are constructed at the preceding stages of the flip-flops. In this embodiment, the timing signal 98 for the R-S flip-flops 95 is formed by delaying a clock signal 97 from a clock source 91 by means of a delay circuit 96, but it may well be identical to the clock signal 97 as in the foregoing embodiment of FIG. 6. In the delay circuit 96, the clock signal 97 may be delayed more than a time delay within a binary counter 92 as well as within an AND array 93.

In this way, the delay of the AND array 93 in the lateral direction (the direction in which the counter is arrayed) can be corrected by the delay circuit 96. On the other hand, the delay of the AND array 93 in the vertical direction (the direction in which the flop-flops are arrayed) cannot be corrected by the delay circuit 96. In this regard, however, if the delay on the vertical interconnection portion of the AND array 93 is equal to a delay on the clock distributing interconnection 98, the correction will be naturally made. When this circuit is realized in an integrated circuit, the arrangement is made as in FIG. 9 also geometrically, and the delay times are made equal. Thus, a highspeed operation in a large array becomes possible.

Figure 10:
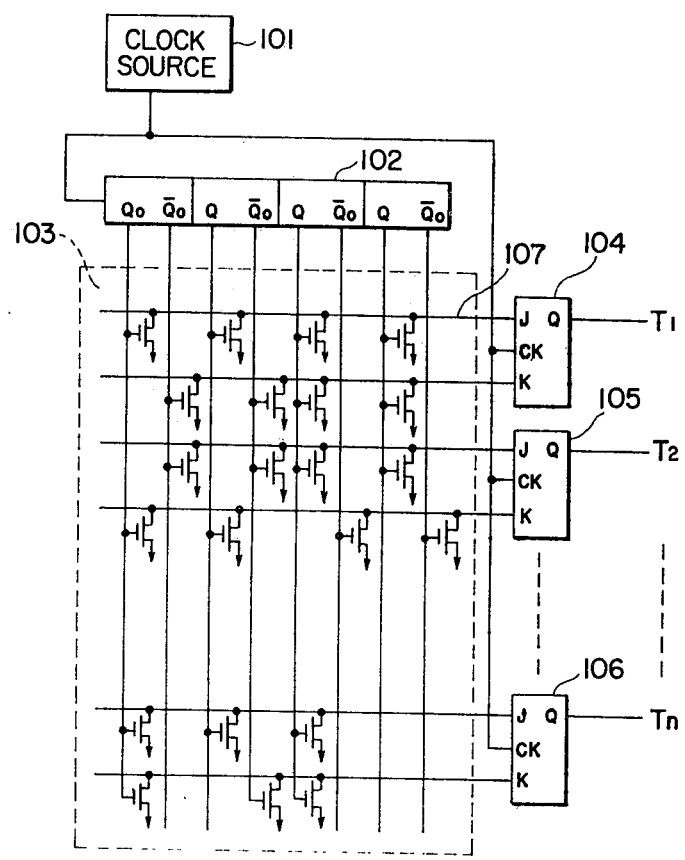

FIG. 10 shows still another embodiment of the timing signal generating circuit according to this invention. In this embodiment, as an AND array 103, AND logics are constructed by the use of MOS transistors. For example, a J input 107 of a J-K flip-flop 104 becomes a level "1" when gate inputs of the MOS transistors connected to the line are of a level "0" and all the MOS transistors are "off". Numeral 101 designates a clock source, and numeral 102 a binary counter.

Figure 11:
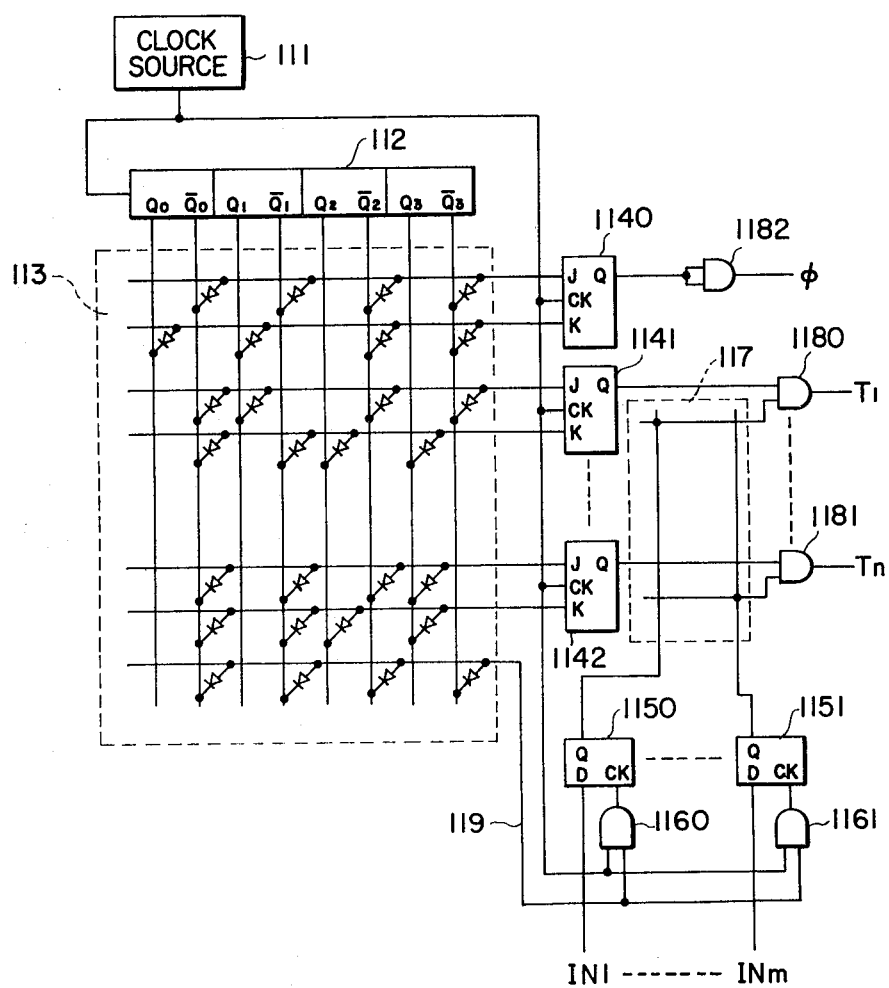

FIG. 11 shows a further embodiment of the timing signal generating circuit according to this invention. In the circuit of FIG. 11, control circuitry is added to outputs of J-K flip-flops 1140, 1141 . . . and 1142, the control circuitry serving to control timing output signals $T_1$, $T_2$, . . . and $T_n$ with separate input signals $IN_l$–$IN_2$, . . . and $IN_m$. The input signals $IN_1$–$IN_m$ need to be synchronized with timing signals which are prepared by a clock source 111, a binary counter 112, an AND array 13 and the J-K flip-flops 1140–1142. Therefore, in order to set or reset D-type flip-flops 1150 and 1151 at the origin of a basic operation cycle, a clock signal from the clock source 111 and an output 119 of the AND array 113 are passed through AND gates 1160 and 1161 to take logical products and the logical product outputs are applied to CK terminals of the flip-flops 1150 and 1151, while the input signals $IN_l$–$IN_m$ are applied to D terminals of the flip-flops 1150 and 1151. In the AND array 113, diode logics are constructed so that the AND array output 119 may be provided when the status of the binary counter 112 is "zero". A logic selection array 117 is capable of arbitrarily combining the connections between outputs of the D-type flip-flops 1150 and 1151 and inputs of AND gates 1180 and 1181 by way of example, the outputs of the D-type flip-flops and the inputs of the AND gates 1180 and 1181 may be caused to orthogonally intersect by means of two layers of aluminum interconnection patterns insulated from each other, and contract holes may be provided at the points of intersection between only lines to-be-connected so as to establish the conduction.

Figure 12:
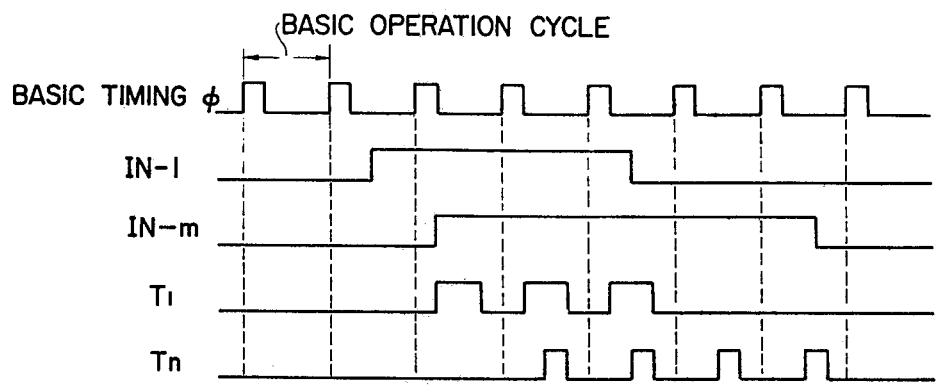
FIG. 12 is a timing chart of the timing signal generating circuit of FIG. 11.

FIG. 12 shows a timing chart in the case of controlling the timing signal $T_1$ with the input signal $IN_l$ and the timing signal $T_n$ with the input signal $IN_m$ in the arrangement of FIG. 11.

When an output signal which is not controlled with the input signals $IN_1$–$IN_m$, such as timing signal $\Phi$ which is obtained by passing the output of the J-K flip-flop 1140 through an AND gate 1182 serving as a delay circuit in FIG. 11, is used as a basic timing signal or a basic clock signal of the device system in FIG. 12, this timing signal is prepared by quite the same circuit as that of the other timing output signals $T_l$, . . . and $T_n$. Therefore, the time relationship of both the signals is relative and is not affected by the performances of the constituent elements. Accordingly, a timing signal generating circuit which exhibits small time deviations between the basic timing signal and the timing output signals is obtained.

Figure 13:
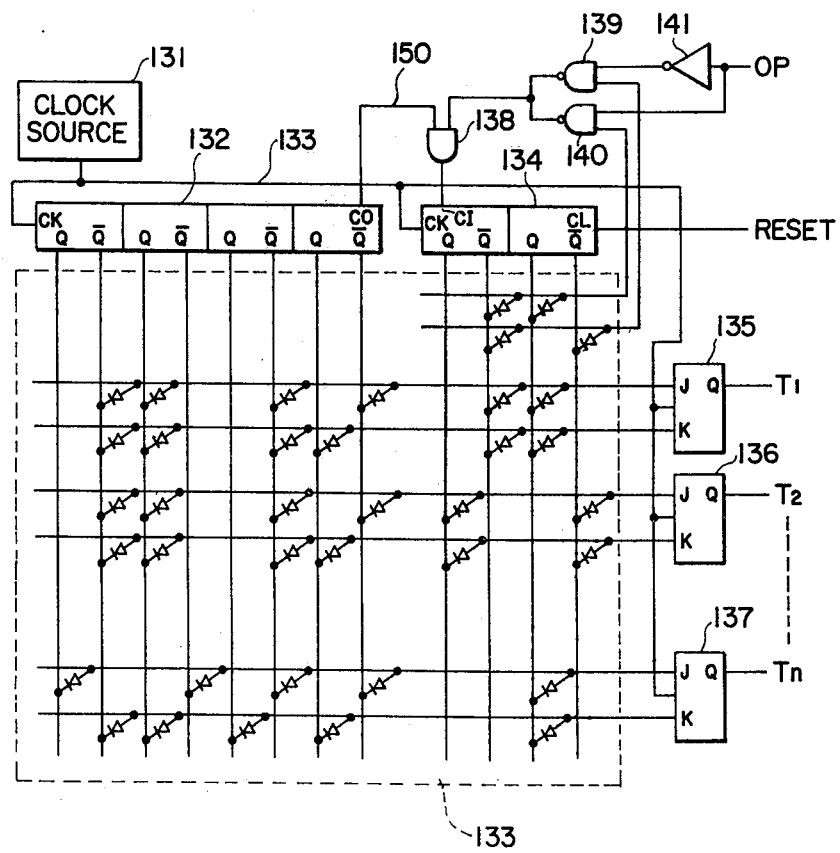
FIG. 13 is a circuit diagram of still another embodiment of the timing signal generating circuit according to this invention.

FIG. 13 shows a yet further embodiment of the timing signal generating circuit according to this invention. A clock source 131, a binary counter 132, and AND array 133 and J-K flip-flops 135–137 have the same functions as in FIG. 6. A control counter 134 controls the counting operation in dependence on a carry-out signal 150 of the binary counter, an input control signal OP, and the status of the control counter itself, and it can put into the sequence operation a plurality of different modes of generating timing signals. Control gates 138, 139, 140 and 141 constitute a control circuit which determines conditions for the counting operation of the control counter 134.

Figure 14:
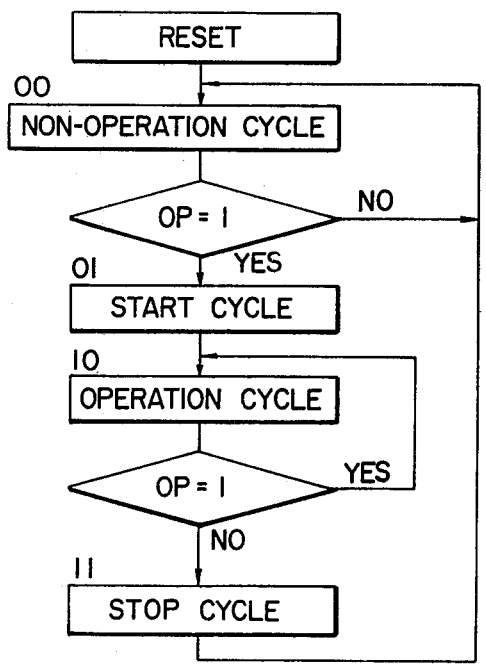
FIGS. 14 and 15 show a sequence flow chart and a timing chart of the embodiment of FIG. 13, respectively.

In case where diode logics in the AND array 133 are set as shown by way of example in FIG. 13, a sequence flow as illustrated in FIG. 14 can be conducted with four statuses of the control counter 134. A non-operation cycle at the time when the status of the control counter is "00" is a mode which generates no timing signal. This mode is attained under the state under which the control counter 134 is reset or the input control signal OP is "off". When the input control signal OP subsequently turns "on", the control counter 134 becomes "01" and executes a start cycle for only one basic operation cycle, whereupon the control counter 134 immediately becomes "10" and repeats operation cycles generating timing signals until the input control signal OP turns "off". By turning the input signal OP "off", the control counter 134 becomes "11" and executes a stop cycle for one basic operation cycle, whereupon the control counter 134 immediately becomes "00" to establish the non-operation cycle.

Figure 15:
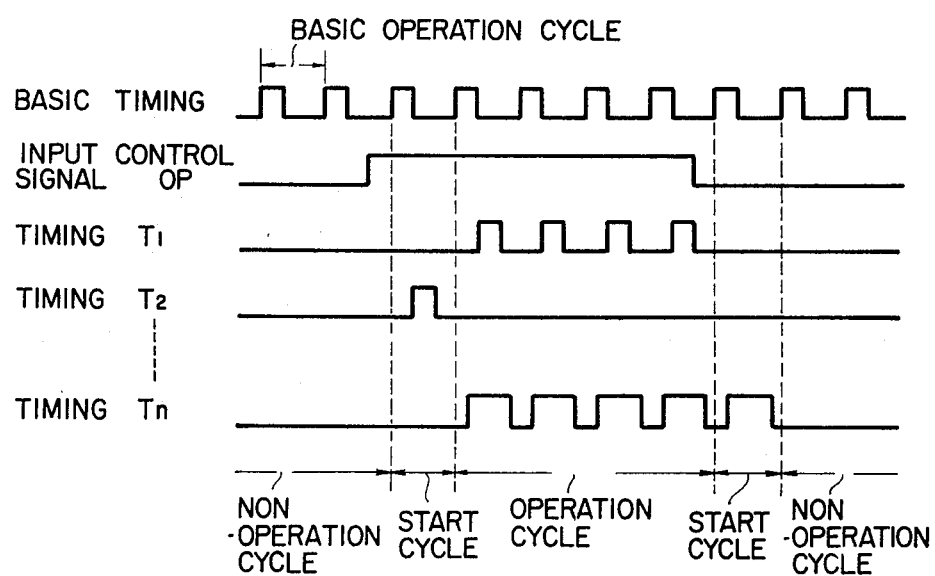

Owing to the sequence flow illustrated in FIG. 14, timing signals $T_1$, $T_2$, ... and $T_n$ become as illustrated in FIG. 15 in case where the diode logics in the AND array 132 are set as shown in FIG. 13. The diode logics are set so that the timing signal $T_1$ may be provided at the operation cycle. They are also set so that the timing signal $T_2$ may be provided only at the start cycle. Diodes are connected in the AND array 132 at only the upper digit bit of the output of the control counter 134 so that the timing signal $T_n$ may be provided at the operation cycle and the stop cycle.

By arranging the control counter 134 and sequence-controlling the plurality of modes for generating the timing signals as described above, a multi-function timing generator circuit can be constructed. Various sequences other than the sequence control exemplified in FIGS. 14 and 15 can be designed in dependence on the setting of the diode logics in the AND array 132, and they shall be included within the scope of this invention.

As set forth above, according to the present invention, the AND array, and in particular the AND circuitry employing diode logics or the like, is utilized as logic circuitry for locating timings, whereby the number of circuit elements can be sharply reduced as compared with that in the ROM system. Assuming by way of example that the number of divisions within the basic operation cycle is 128 and that the number of timing signals to be generated is 6, a memory capacity of $128 \times 16 = 2,048$ (bits) is requird in the ROM system. On the other hand, in case of using diodes for the AND array, $7 \times 16 \times 2 = 224$ diodes suffice. In the case where the number of divisions within the basic operation cycle is doubled, the capacity needs to be doubled with the ROM system, whereas the number of diodes increases merely double the number of timing signals with the AND array system. Accordingly, the effect of curtailing the number of circuit elements become increasingly great.

It is accordingly possible to realize the integration of the timing signal generating circuit more easily. As another effect, the AND array has a shorter internal delay time than the ROM, so that a timing generating circuit of higher speed can be realized. A further advantage is that the time positions and widths of the timing signals can be set more simply and directly. More specifically, according to this invention, the diodes may be connected only at the timing positions at which the flip-flops are set and reset, and it is unnecessary to set "1" and "0" over all the bits as in the ROM system.

Although this invention has been described above along the preferred embodiments, it is not restricted thereto as stated below in regard to the constituent numbers and operations.

The numbers of constituent bits of the binary counter and the control counter are 4 and 2 in the embodiments, but they may be any values. The number of division within the basic operation cycle is not restricted to $2^n$ (n being an integer), but it can be set at an arbitrary number m. In this case, a circuit with which the status of the binary counter returns to zero when it has become (m−1) may be added.

We claim:

1. A timing signal generating circuit comprising clock source means for generating basic clock pulses of a predetermined period, binary counter means for counting the number of clock pulses from said clock source means and for providing the count value as a binary code output, means forming a logical array for decoding the output of said binary counter means and providing outputs, said logical array means including semiconductor elements arrayed in the form of a matrix, and flip-flop means for being set and reset in response to outputs of said logical array means at the timing of the clock pulses applied thereto from said clock source means and providing outputs for utilization as timing signals.

2. A timing signal generating circuit according to claim 1, wherein said semiconductor elements are diodes.

3. A timing signal generating circuit according to claim 1, wherein said semiconductor elements are MOS transistors.

4. A timing signal generating circuit according to claim 1, 2 or 3 wherein said flip-flop means comprise J-K flip-flops.

5. A timing signal generating circuit comprising clock source means for generating clock pulses of a predetermined period, first binary counter means for counting the number of the clock pulses from said clock source means and providing the count value as a binary code output and a carry-out signal, input means for applying a predetermined control signal, second binary counter means for counting the number of the pulses corresponding to the carry-out signal of said first binary counter means and the control signal from said input means and providing the count value as a binary code output, means forming a logical array for decoding the outputs of said first and second binary counter means, and flip-flop means for being set and reset by outputs of said logical array means in response to the clock pulses from said clock source means and providing outputs for utilization as timing signals.

6. A timing signal generating circuit according to claim 5, wherein said input means comprises means forming another logical array for decoding the output of said second binary counter means, and providing an output means for applying a control command, and gate means for providing said control signal in response to said control command from said applying means and an output of said another logical array means.

7. A timing signal generating circuit comprising clock source means for generating basic clock pulses of a predetermined period, binary counter means for counting the number of the clock pulses from said clock source means and for providing the count value as a binary code output, means forming a logical array for decoding the output of said binary counter means and providing outputs, said logical array means including semiconductor elements arrayed in the form of a matrix, and flip-flop means for being set and reset by outputs of said logical array means in response to the clock pulses from said clock source means and providing outputs for utilization as timing signals, further comprising input means for applying predetermined input signals, another flip-flop means for storing the input signals from said input means in response to the clock signals from said clock source means and a timing signal corresponding to the zero output of said binary counter means, and AND gate means for taking the logical products between outputs of said another flip-flop means.

8. A timing signal generating circuit according to claim 1, 2 or 3, further including delay means for delaying the clock pulses from said clock source means, said flip-flop means being set and reset in response to the delayed clock pulses.

9. A timing signal generating circuit according to claim 8, wherein said flip-flop means comprise R-S flip-flops.

10. A timing signal generating circuit comprising clock source means for generating basic clock pulses of a predetermined period, binary counter means for counting the number of the clock pulses from said clock source means and for providing the count value as a binary code output, means forming a logical array for decoding the output of said binary counter means and providing outputs, said logical array means including semiconductor elements arrayed in the form of a matrix, and flip-flop means for being set and reset by outputs of said logical array means in response to the clock pulses from said clock source means and providing outputs for utilization as timing signals, said flip-flop means being arranged for receiving the clock pulses from said clock source means for being set and reset by the outputs of said logical array means in response to the clock pulses.

* * * * *